US005576575A

United States Patent [19]
Terasawa

[11] Patent Number: 5,576,575
[45] Date of Patent: Nov. 19, 1996

[54] SEMICONDUCTOR CONVERSION DEVICE

[75] Inventor: Noriho Terasawa, Nagano, Japan

[73] Assignee: Fuji Electric Co., Ltd., Tokyo, Japan

[21] Appl. No.: 567,796

[22] Filed: Dec. 6, 1995

Related U.S. Application Data

[63] Continuation of Ser. No. 154,621, Nov. 18, 1993, abandoned.

[30] Foreign Application Priority Data

Nov. 18, 1993 [JP] Japan ................................ 4-307397

[51] Int. Cl.$^6$ .................................................. H01L 29/00
[52] U.S. Cl. ......................................... 257/503; 257/499
[58] Field of Search ................................... 257/664, 691, 257/776, 785, 658, 503, 587

[56] References Cited

U.S. PATENT DOCUMENTS

| | | | |
|---|---|---|---|
| 4,514,749 | 4/1985 | Shoji | 357/68 |
| 4,583,111 | 4/1986 | Early | 251/658 |
| 4,670,833 | 6/1987 | Sachs | 363/132 |
| 4,831,497 | 5/1989 | Webster et al. | 361/406 |
| 4,941,031 | 7/1990 | Kumagai et al. | 251/758 |
| 5,057,970 | 10/1991 | Chave | 361/386 |
| 5,077,595 | 12/1991 | Fukunaga | 357/40 |
| 5,253,156 | 10/1993 | Sakurai et al. | 363/98 |

FOREIGN PATENT DOCUMENTS

| | | |
|---|---|---|
| 58213456 | 3/1984 | Japan . |
| 2065238 | 5/1990 | Japan . |

Primary Examiner—Jerome Jackson
Assistant Examiner—Nathan K. Kelley
Attorney, Agent, or Firm—Brumbaugh, Graves, Donohue & Raymond

[57] ABSTRACT

A semiconductor conversion device is disclosed with particular utility in connection with minimizing malfunctions of the device's switching elements. The conversion device according to the present invention has a bridge circuit configuration and consists of a main transistor circuit and a drive-circuit network for controlling the transistor switching operation. The main transistor circuit consists of at least one semiconductor switching element for each of at least one upper-arm circuit and one lower-arm circuit. The drive-circuit network consists of individual component drive circuits associated with the respective semiconductor switching elements. The component drive circuits are mounted on wiring patterns of a foil-like conductor on a printed wiring substrate. The wiring patterns of the individual component drive circuits are configured to minimize the value of the parasitic capacitance formed between the wiring patterns. This, in turn, prevents individual drive circuits from malfunctioning due to high-frequency noise currents. Furthermore, a dedicated individual reference electrical potential line is provided for each of the drive circuits and connected to a common reference electrical potential line. As a result, the reference electrical potential remains constant for each reference electrical potential line, and the individual drive circuits are prevented from delivering incorrect drive signals due to varying reference electrical potential.

17 Claims, 4 Drawing Sheets

SEMICONDUCTOR CONVERSION DEVICE

This application is a continuation of application Ser. No. 08/154,621, filed on Nov. 18, 1993, now abandoned.

BACKGROUND OF THE INVENTION

This invention relates to a semiconductor current-conversion device, and more particularly to a semiconductor conversion device having semiconductor switching elements in a main circuit configured as a bridge circuit, which device has a drive-circuit configuration that minimizes device malfunctioning.

Figure 3:
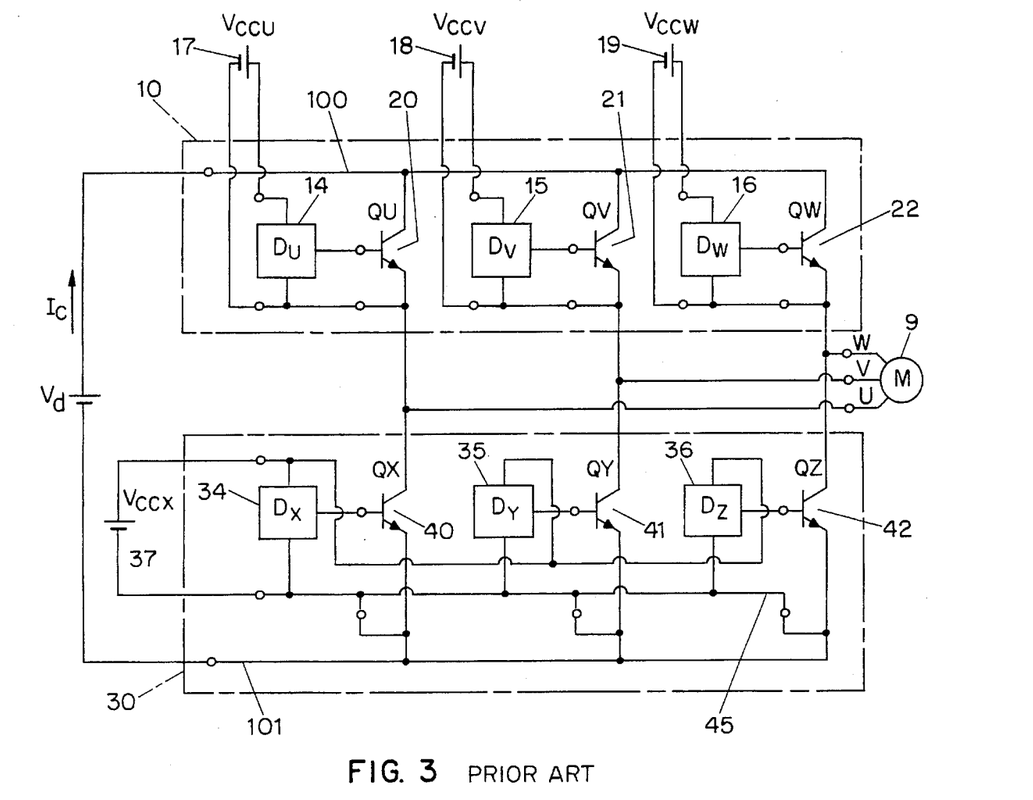
FIG. 3 is a circuit diagram of a known three-phase inverter circuit.

Among the known current-conversion devices for converting AC to DC and vice versa, semiconductor conversion devices having semiconductor switching elements in a main circuit configured as a bridge circuit have been used as inverters for electric power and other applications. For DC to AC conversion, these semiconductor conversion devices incorporate three-phase inverter circuits, an example of which is shown in FIG. 3, that convert direct currents to three-phase alternating currents with a variable frequency. As can be seen from FIG. 3, the three-phase inverter has a three-phase bridge circuit configuration and supplies three-phase alternating currents to a load, an electric motor 9, by converting a DC power supply $V_d$. The three-phase inverter consists of an upper-arm circuit 10, which controls the higher electrical potential side of a three-phase alternating voltage, and a lower-arm circuit 30 which controls the lower electrical potential side of the three-phase alternating voltage.

The upper-arm circuit 10 consists of a main transistor circuit and a drive-circuit network. As shown in FIG. 3, the main transistor circuit of the upper-arm circuit 10 consists of bipolar transistors 20, 21 and 22 which act as switching elements and are positioned at U, V and W branches of the upper-arm circuit, respectively. The drive-circuit network of the upper-arm circuit 10 consists of component drive circuits 14, 15 and 16 which deliver driving signals to the respective transistors 20, 21 and 22, thereby causing these transistors to perform switching operations. The component drive circuits 14, 15 and 16 are powered by supplementary DC power supplies 17, 18 and 19, respectively, which are individually insulated from the outside. The source of control signals for the component drive circuits 14, 15 and 16 are not shown for sake of clarity.

The lower-arm circuit 30 shown in FIG. 3 has essentially the same configuration as the upper-arm circuit 10. A main transistor circuit of the lower-arm circuit 30 consists of bipolar transistors 40, 41 and 42 which act as switching elements and are positioned at X, Y and Z branches of the lower-arm circuit, respectively. A drive-circuit network of the lower-arm circuit 30 consists of component drive circuits 34, 35 and 36 which deliver driving signals to the respective transistors 40, 41 and 42, thereby causing these transistors to perform switching operations. The component drive circuits 34, 35 and 36 are powered by a common, external supplementary DC power supply 37.

The three-phase inverter represented by the circuit diagram shown in FIG. 3 is powered by a main DC power supply $V_d$, which supplies the inverter with a DC current $I_c$. The switching operations of the transistors 20–22 and 40–42 allow current flow through the load, the motor 9, and thereby allow supply of three-phase alternating voltage to the load.

Figure 4:
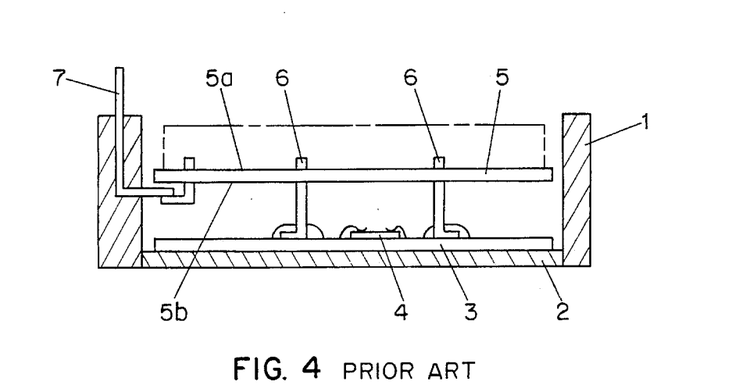
FIG. 4 is a side elevation view of circuit substrates used in configuring the three-phase inverter shown in FIG. 3.

In fabricating a three-phase inverter as shown in FIG. 3, two circuit substrates, examples of which are shown in FIG. 4, are typically used. With reference to FIG. 4, the two main transistor circuits consisting of transistors 20–22 and 40–42, respectively, are configured on a main-circuit substrate 3 by mounting a semiconductor chip 4 containing the two main transistor circuits. The two drive-circuit networks consisting of components drive circuits 14–16 and 34–36, respectively, are configured and integrally mounted on a drive-circuit substrate 5.

Both the main-circuit substrate 3 and the drive-circuit substrate 5 are housed inside a container consisting of a case 1 and a base 2 which has good heat conductivity. The main-circuit substrate 3 and the drive-circuit substrate 5 are connected to each other via an internal connection lead 6. Furthermore, an external connection lead 7 allows the drive-circuit substrate 5 to be supplied with external control signals and be connected to supplementary power supplies 17–19 and 37.

Figure 5:
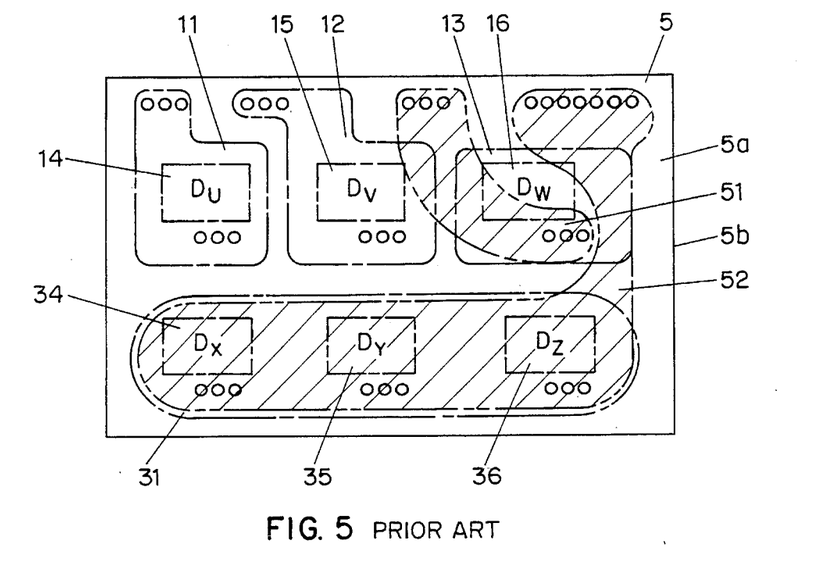
FIG. 5 is a top plan view of the drive-circuit substrate of a prior-art, three-phase inverter.

In the above-described conventional three-phase inverters, the drive-circuit substrate 5 is configured as shown in FIG. 5. With reference to FIG. 5, the drive-circuit substrate 5 is a double-sided printed wiring substrate, and the component drive circuits 14–16 and 34–36 are integrally mounted on the top surface 5a of the drive circuit substrate 5. In the individual component drive circuits 14–16, the ground electrode is tied to an emitter of the respective transistors 20–22 of the upper-arm circuit 10. Thus, the wiring patterns 11–13 for the component drive circuits 14–16, respectively, consist of a foil-like conductor formed on the top surface 5a of the drive-circuit substrate 5. The wiring patterns 11 and 12 for the respective component drive circuits 14 and 15 are integrally formed with a terminal portion tied to the connection leads 6 and 7. The wiring pattern 13 for the component drive circuit 16 has a separately formed sub-portion, a wiring pattern 51 formed on the bottom surface 5b of the drive-circuit substrate 5, which wiring pattern 51 extends to a terminal portion tied to the connection leads 6 and 7.

Figure 6:
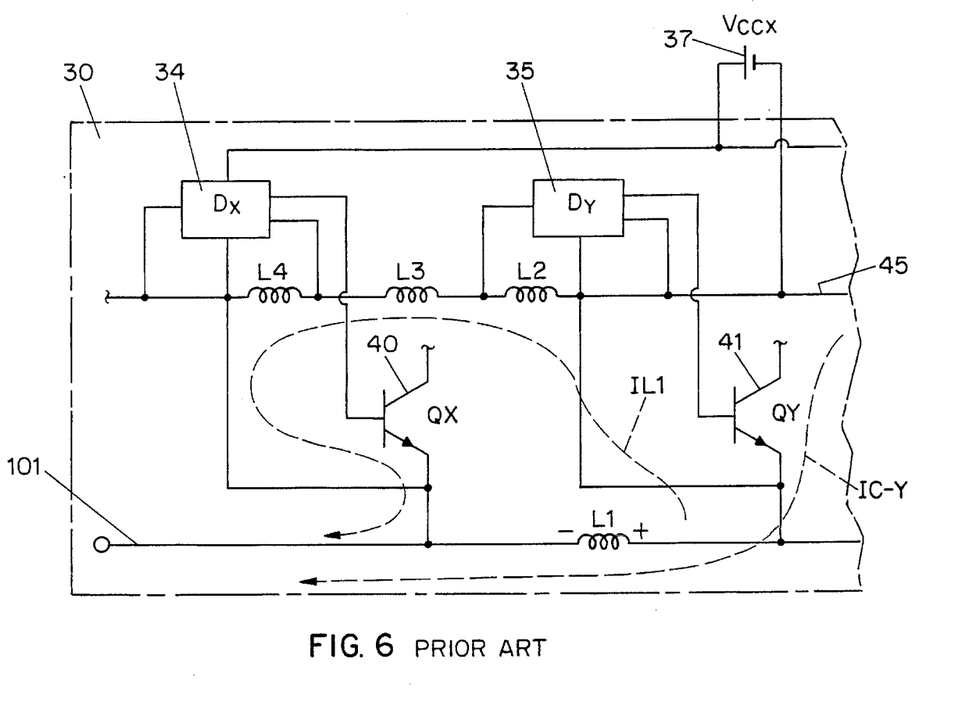
FIG. 6 is a circuit diagram of a portion of the prior-art, three-phase inverter shown in FIG. 5.

Next, in the individual component drive circuits 34–36, respective ground electrodes are connected to a line 45, to which emitters of the respective transistors 40–42 of the lower-arm circuit 30 are in turn connected, as shown in FIG. 6. The line 45 is a common ground-potential line having a common reference potential equal to the potential of the negative electrode side of the supplementary power supply 37. Thus, individual component drive circuits 34–36 are mounted on a common wiring pattern 31. The common wiring pattern 31 consists of a foil-like conductor on the top surface 5a of the double-sided printed wiring substrate 5. The wiring pattern 31 has a separately formed sub-portion, a wiring pattern 52 formed on the bottom surface 5b of the double-sided printed wiring substrate 5 serving as the drive-circuit substrate, which wiring pattern 52 extends to a terminal portion tied to connection leads 6 and 7.

The conventional drive-circuit substrate 5 shown in FIG. 5 which has wiring patterns on both of its surfaces 5a and 5b provides sufficient electric insulation between the individual component drive circuits 14–16, and also between the component drive circuits 14–16 and the wiring pattern 31 consisting of individual drive circuits 34–36.

In the three-phase inverter with the circuit configuration shown in FIG. 3, the upper-arm circuit transistors 20–22 and the lower-arm circuit transistors 40–42 alternately and periodically perform switching operations in response to external control signals in order to convert the main DC power supply $V_d$ to three-phase alternating currents. In this operation, the respective upper-arm circuit transistors 20–22 perform switching operations at time intervals corresponding to a phase angle of 120°, thereby keeping the three-phase alternating currents balanced. Furthermore, the two groups of the upper-arm circuit transistors 20–22 and the lower-arm circuit transistors 40–42 must alternately perform switching operations at time intervals corresponding to a phase angle of 180° so that mutually opposing transistors, e.g., transistors 20 and 40, will not be simultaneously turned on.

One of the key considerations in configuring a semiconductor conversion device is the prevention of malfunctioning of semiconductor switching elements. A malfunctioning semiconductor switching element will cause a circuit arm to short, thereby resulting in excessive current flow through the circuit. Consequences are often serious, as destruction of the semiconductor switching element or the load equipment may occur.

The recent advances in semiconductor technology has substantially reduced the occurrences of semiconductor switching elements' malfunctioning, and has improved the reliability of semiconductor conversion devices in general. However, semiconductor conversion devices' malfunctioning may also be caused by factors other than the semiconductor switching elements, such as the configuration of the drive-circuit substrate. In a conventional three-phase inverter as shown in FIG. 3, the electrical potentials of the emitters of the transistors 20–22 vary at different times due to the above-mentioned switching operations of the transistors 20–22 and 40–42. Accordingly, in the drive circuit substrate of the conventional three-phase inverter, the electrical potentials of the respective wiring patterns connected to the transistors 20–22 are also constantly changing.

For the configuration of the drive-circuit substrate 5 provided in the prior art three-phase inverter as described above in conjunction with FIG. 5, the wiring pattern 13 on which the individual drive circuit 16 is mounted, and the wiring pattern 51 which is electrically connected to the wiring pattern 13, create an undesirable effect. The wiring configurations are such that the wiring patterns 13 and 52 mutually oppose each other with the double-sided printed wiring substrate 5 intervening between the two wiring patterns. Similarly, the pair of wiring patterns 51 and 12 mutually oppose each other. These opposing wiring patterns provide a relatively large parasitic capacitance because they have a configuration similar to that of a capacitor.

Since high-frequency currents easily pass through such a large parasitic capacitance, if the electrical potential of the emitter of the transistor 22 changes rapidly, high-frequency currents flow from the wiring patterns 13 and 51 to the wiring patterns 52 and 12, respectively, via the parasitic capacitor. High-frequency currents create electrical noise and may cause the transistors 21 and 40–42, which are driven respectively by the individual drive circuits 15 and 34–36 mounted on the wiring patterns 12 and 31, to malfunction.

Figure 7:
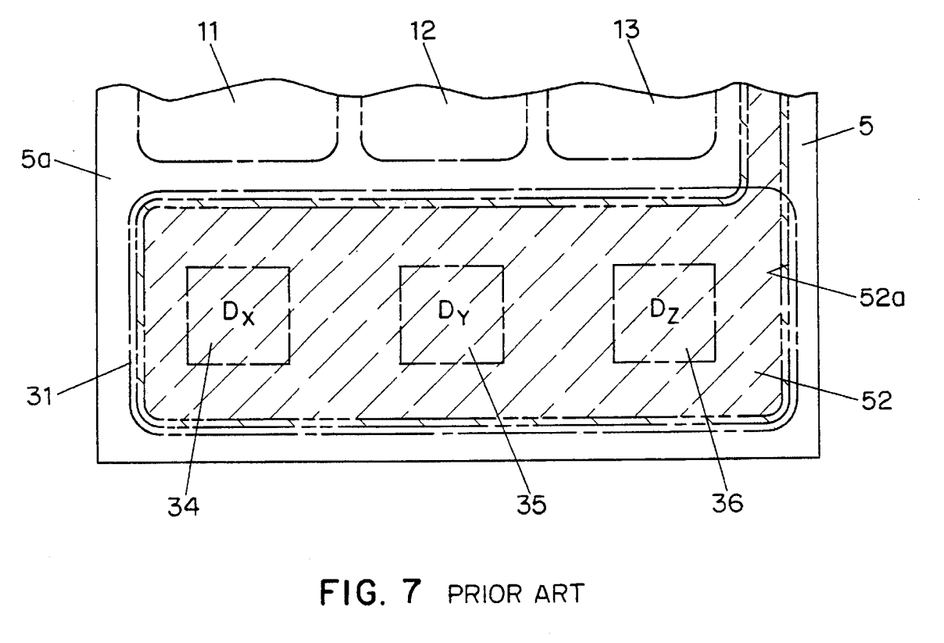
FIG. 7 is a top plan view of a portion of the drive-circuit substrate of the prior-art, three-phase inverter shown in FIG. 5.

It should be noted that the wiring pattern 31 is longer than wiring patterns 11–13 because the wiring pattern 31 has individual component drive circuits 34–36 integrally incorporated thereon. Furthermore, the wiring pattern 52 is longer than the wiring pattern 31 because the wiring pattern 52 must cover the entire range of the wiring pattern 31 and also include the terminal portion connected to the connection leads 6 and 7. As shown in FIG. 7, the wiring pattern 52 incorporates a sub-pattern 52a for the common ground-potential line 45 formed thereon. The wiring pattern 52a is formed at the periphery of the wiring pattern 52, as shown in FIG. 7.

The ground-potential line 45 provides a common reference potential for the individual drive circuits 34–36, and is electrically connected to the emitters of the transistors 40–42 and the negative electrode side of the supplementary power supply 37. Consequently, the ground-potential line 45 is electrically connected to the emitters of the respective transistors 40–42 and the main circuit line 101. In addition, part of the main DC electric current $I_c$ branches off from the main circuit line 101 and flows to the ground-potential line 45. In particular, if the main DC electric current $I_c$ contains high frequency components, the inductance of the main circuit line 101 will cause more high-frequency components to branch off to the ground-potential line 45.

FIG. 6, which illustrates the above-described effects in detail, shows a relevant portion of the ground-potential line 45 along with the surrounding circuit configurations. As illustrated in FIG. 6, when the transistor 41 is switched on, DC-side main electric current $I_{CY}$, flowing to the negative electrode side of the main DC power supply $V_d$, starts to flow through the main circuit line 101 to which the emitter of the transistor 41 is connected. Immediately after the transistor 41 is switched on, the value of the main DC current $I_{CY}$ increases rapidly when the current contains a large number of high-frequency components.

As an additional source of problems, there is always a parasitic inductance L1, either intended or unintended, associated with a portion of the main circuit line 101 located between the emitter of the transistor 41 and the emitter of the transistor 40. The existence of parasitic inductance L1 creates a diverted current $I_{L1}$ to flow to the ground-potential line 45. As indicated in FIG. 6, the diverted current $I_{L1}$ flows from the main circuit line 101, passes through a junction of the emitter of the transistor 41, through the ground-potential line 45, then through a junction of the emitter of the transistor 40, finally returning to the main circuit line 101.

The diverted current flow $I_{L1}$ generates a high-frequency voltage at parasitic inductances L2, L3 and L4 associated with the ground-potential line 45. Consequently, circuit elements having a ground connected between the inductances, i.e., the circuit elements forming the individual component drive circuits 34 and 35, have varying ground potentials as a function of time. Changing ground potentials for each of the component drive circuits prevents proper functioning of the circuit elements. More particularly, the transistors 40 and 41 may malfunction due to the individual component drive circuits 34 and 35 delivering incorrect drive signals. Likewise, the same phenomenon also applies to the individual drive circuit 36 associated with the transistor 42.

There is therefore a need for improved wiring patterns for the drive-circuit substrates incorporated in semiconductor conversion devices such as inverters, which wiring pattern will minimize malfunctioning of semiconductor conversion devices.

SUMMARY OF THE INVENTION

In accordance with this invention is provided a semiconductor conversion device having semiconductor switching elements in a main circuit configured as a bridge circuit, in particular a semiconductor current-conversion device having a drive-circuit wiring configuration that minimizes device malfunctioning due to parasitic capacitances and inductances.

An embodiment of the semiconductor conversion device according to the present invention has a bridge circuit configuration and consists of a main transistor circuit and a drive-circuit network for controlling the transistor switching operation. The main transistor circuit consists of at least one semiconductor switching element for each of at least one upper-arm circuit and one lower-arm circuit. The drive-circuit network consists of individual component drive circuits associated with the respective semiconductor switching elements. The component drive circuits are mounted on wiring patterns of a foil-like conductor on a printed wiring substrate. The wiring patterns are configured relative to one another in such a manner that no wiring pattern associated with the component drive circuits for the semiconductor switching elements of the upper-arm circuit is positioned opposite to one of the wiring patterns associated with the component drive circuits for the semiconductor switching elements of the lower-arm circuit, with an intervening insulated material layer of the printed wiring substrate.

In the semiconductor conversion device according to this invention, the wiring patterns of the individual component drive circuits which drive the semiconductor switching elements are configured such that no two wiring patterns are formed in opposition to each other with an intervening insulated layer of the printed wiring substrate located between the opposing wiring patterns, thereby minimizing the value of the parasitic capacitance formed between the wiring patterns. This, in turn, makes the value of the high-frequency noise currents flowing across the parasitic capacitors formed between opposing wiring patterns very small, thereby preventing individual drive circuits from malfunctioning due to high-frequency noise currents.

Furthermore, in the embodiment of a semiconductor conversion device according to the present invention, associated with each of the component drive circuits is a common reference electrical potential line and an individual reference electrical potential lines. The individual reference electrical potential lines provide dedicated reference electrical potential for corresponding drive circuits, and each of the individual reference electrical potential lines are connected to the common reference electrical potential line. Therefore, when a portion of the main DC current supplied from the main DC power supply $V_d$ to the main circuit of the semiconductor conversion device is diverted and flows across the common reference electrical potential line, the electrical potentials of the respective reference electric potential lines become equal to the electric potential of the point to which the common reference electric potential line is connected. In this case, the reference electrical potential remains constant for each reference electrical potential line. This prevents the individual drive circuit from delivering incorrect drive signals due to varying reference electrical potential associated with a given individual component drive circuit.

An embodiment of the semiconductor conversion device according to the present invention can be used, for example, as an inverter supplying a variable-frequency, alternating voltage for controlling an electric motor. In such applications, the wiring pattern of the drive circuits in the inverter greatly reduces the possibility of a malfunction of individual drive circuits, thereby improving the reliability of the inverter and eliminating potentially serious accidents.

DETAILED DESCRIPTION OF THE INVENTION

The three-phase inverter according to this invention utilizes a main-circuit substrate 3 and a drive-circuit substrate 5 substantially similar to those of the prior art substrates shown in FIG. 4. In addition, the three-phase inverter according to this invention has essentially the same equivalent-circuit configuration for its main circuit as the prior art device shown in FIG. 3.

Figure 1:
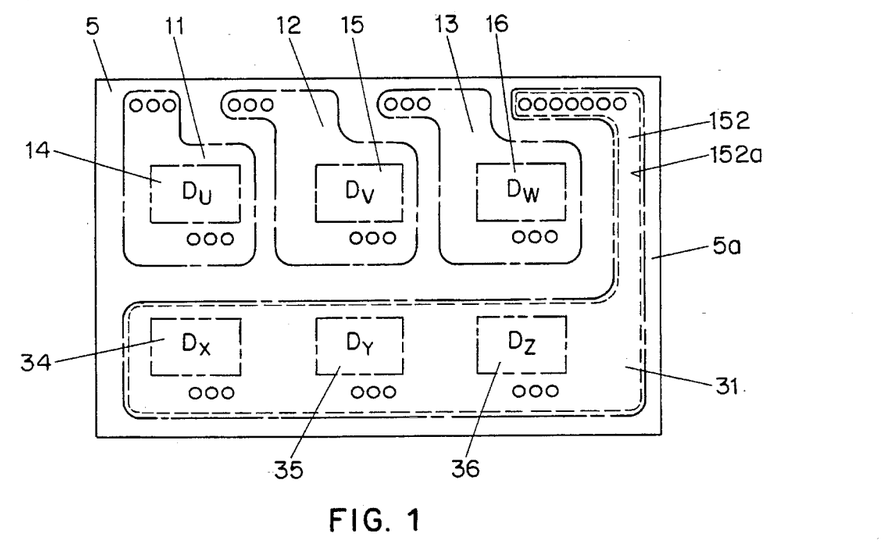
FIG. 1 is a top plan view of the drive-circuit substrate of a three-phase inverter according to this invention.

As shown in FIG. 1, the drive-circuit substrate 5 of the device according to this invention incorporates independent wiring patterns 11–13 for the respective drive circuits 14–16. The wiring patterns 11–13, each having a terminal portion connected to external connection leads 6 and 7 which are not shown, are integrally formed on a top surface 5a of the substrate 5. The wiring configuration of FIG. 1 eliminates the need for the wiring pattern 51 included in the prior art device.

As shown in FIG. 1, a common wiring pattern for the individual component drive circuits 34–36 is integrally formed on the top surface 5a of the drive-circuit substrate 5. Also included in the common wiring pattern and formed on the top surface 5a is a portion 152, which has the same configuration as the wiring pattern 52 of the prior art device shown in FIG. 5. Accordingly, a terminal portion connected to the connection leads 6, 7 and a wiring pattern 152a for a common ground-potential line 45, also referred to as a common reference-potential line, corresponding to the wiring pattern 52a shown in FIG. 7, are also formed on the top surface 5a of the substrate 5. Consequently, the wiring patterns 11–13 and 31 have no directly opposing wiring patterns, and no parasitic capacitor, consisting of a pair of opposing wiring patterns separated by the double-sided printed wiring substrate, is formed.

The absence of mutually opposing wiring patterns makes the value of a parasitic capacitance formed between the wiring patterns 11–13 and 31 very small. As a result, the value of noise-inducing, high-frequency currents flowing across the parasitic capacitor, i.e., between the mutually opposing wiring patterns, is very small. The decreased level of high-frequency current substantially reduces the possibility that the drive circuits 14–16 and 34–36, and transistors 20–22 and 40–42 will malfunction due to high-frequency noise currents. Accordingly, a very reliable three-phase inverter may be made by utilizing the drive-circuit wiring pattern shown in FIG. 1.

So far, this invention has been described in conjunction with the drive circuit substrate 5, which is configured using a double-sided printed wiring substrate. However, the invention is not limited to such a configuration. The present invention can be implemented with a single-sided printed wiring substrate used as the drive-circuit substrate in a three-phase inverter, with individual drive circuits driving the respective transistors provided in the main circuit with a bridge-circuit configuration. Even if single-sided printed wiring substrate are used, the advantages of the present invention can be realized as long as the wiring patterns, on which the individual drive circuits are mounted, are disposed such that no mutually opposing wiring patterns with an intervening insulated substrate.

Figure 2:
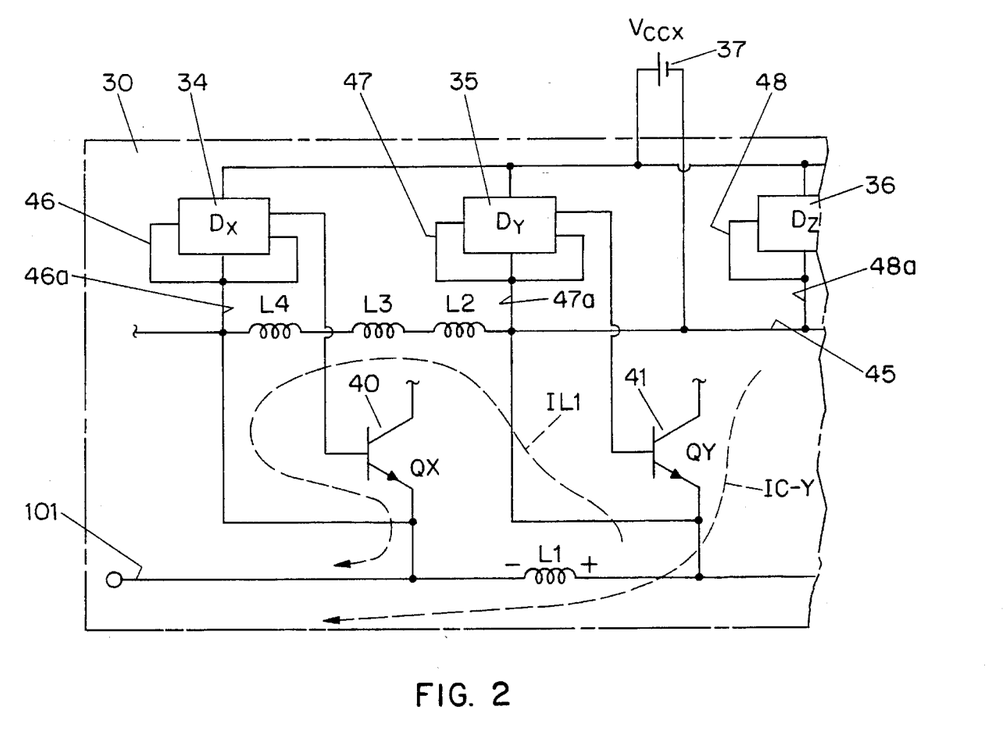
FIG. 2 is circuit diagram of a portion of a three-phase inverter according to this invention.

In addition, as shown in FIG. 2, the present invention has been so far described in conjunction with a three-phase inverter in which conventional bipolar NPN transistors are used as semiconductor switching elements. However, the invention is not limited to an inverter utilizing only such transistors. Similar effects can be obtained by using bipolar PNP transistors, MOSFETs, IGBTs, voltage-driven transistors or thyristors as semiconductor switching elements.

Moreover, the present invention has been so far described for an embodiment which incorporates the wiring pattern 152a for the common ground-potential line 45 on the periphery of the wiring pattern 152 such that 152a surrounds the area of the wiring pattern 152. Once again, the present invention is not limited to such a configuration. If a double-sided printed wiring substrate is used, the wiring pattern 152a may be separated from the wiring pattern 152 and formed on a conductor layer that is separate from the conductor layer on which the wiring pattern 152 is formed. In this case, it is preferable for the wiring pattern 152a to trace the configuration of the wiring pattern 152 (except for the terminal part) such that the wiring patterns 152 and 152a run parallel to each other. This configuration increases the total sectional area of the conductors, thereby reducing the values of the parasitic inductance and resistance which may cause varying ground potentials.

As shown in FIG. 2, the three-phase inverter according to the present invention incorporates individual drive-circuit ground-potential lines 46 and 47, also referred to as drive-circuit reference-potential lines, for the individual drive circuits delivering drive signals to the lower-arm circuit transistors 40 and 41, respectively. The drive-circuit ground-potential lines 46 and 47 provide a ground potential equal to a negative-electrode potential of the external supplementary DC power supply 37. In addition, the drive-circuit substrate 5 provided in the three-phase inverter according to this invention has graphic or wiring patterns corresponding to the individual drive circuits 46 and 47 formed thereon.

As shown in FIG. 2, the drive-circuit ground-potential lines 46, 47 and 48 are connected at a single point, via the connection lines 46a, 47a and 48a, respectively, to the common ground-potential line 45.

The physical operation of the drive-circuit of the semiconductor conversion device according to the present invention having dedicated individual ground-potential lines provided for the individual component drive circuits 34–36 will be described in further detail. When the diverted current $I_{L1}$ of the main DC current $I_c$, shown in FIG. 2 and supplied from the main DC power supply $V_d$ to the main circuit of the three-phase inverter, flows across the common ground-potential line 45, the ground potentials of the individual ground-potential lines 46–48 become equal to the electric potential of the point at which the connection lines 46a, 47a and 48a connect to the common ground-potential line 45.

In the circuit shown in FIG. 2, the electric potential may vary among the individual ground-potential lines 46–48. However, the ground potential of a given individual ground-potential line 46, 47 or 48 will be constant. Accordingly, even if a portion the current flow across the parasitic inductances L2, L3 and L4 associated with the common ground-potential line 45 is diverted, and the ground potentials vary among the individual component drive circuits, the ground potential for a given drive circuit 46, 47 or 48 will remain constant. This prevents the individual drive circuits 46–48 from malfunctioning due to a changing ground potential.

This invention has so far been described in conjunction with an embodiment in which bipolar NPN transistors are used as semiconductor switching elements. However, if a three-phase inverter incorporates PNP transistors for at least the upper-arm circuit portion, the electric potentials of the emitters of the upper-arm circuit transistors will be common. Therefore, malfunction of the individual drive circuits can be reduced by providing a dedicated individual reference-potential line which sets an emitter electric potential for each individual drive circuit, as described above.

Furthermore, although this invention has been described so far in conjunction with an embodiment which is an inverter, the present invention is not intended to be limited to such devices. Other semiconductor conversion devices are contemplated within the scope of the present invention, such as converters which convert alternating currents to direct currents.

I claim:

1. A semiconductor conversion device having a bridge circuit configuration, which comprises:

a main circuit having two branches, an upper arm and a lower arm;

at least one semiconductor switching element contained within each of the lower-arm and upper-arm circuit branches;

a drive-circuit wiring substrate having an insulation layer; and a drive-circuit network mounted on the drive-circuit wiring substrate, the drive-circuit network having a first common ground-potential line, and individual component drive circuits corresponding to the respective semiconductor switching elements for controlling switching operations, the individual component drive circuits being formed on wiring patterns on the drive-circuit wiring substrate, each individual component drive circuit having a plurality of ground-potential points, with each of the plurality of ground-potential points within each individual component drive circuit being connected to a respective second common ground-potential line which is connected to the first common ground-potential line, so that, in device operation, each of the plurality of ground-potential points within each individual component drive circuit is at the same respective potential;

wherein the wiring patterns for the component drive circuits associated with the upper-arm circuit branch are positioned relative to the wiring patterns for the component drive circuits associated with the lower-arm circuit branch such that any pair of the wiring patterns for the component drive circuits, consisting of a first wiring pattern for the component drive circuit associated with one of the upper-arm circuit branches and a second wiring pattern for the component drive circuit associated with one of the lower-arm circuit branches, do not mutually oppose each other with the first and the second wiring patterns being separated by the insulation layer of the drive-circuit wiring substrate.

2. A device according to claim 1, wherein said bridge circuit is a three-phase bridge circuit, and said device comprises three semiconductor switching elements contained within each of the lower-arm and upper-arm circuit branches.

3. A device according to claim 1, wherein said main circuit is formed on a substrate separate from the drive-circuit wiring substrate, and the drive-circuit wiring substrate is a double-sided, printed wiring substrate.

4. A device according to claim 3, wherein at least one said wiring patterns comprises a foil-like conductor on the drive-circuit wiring substrate.

5. A device according to claim 2, wherein said semiconductor switching elements are bipolar transistors.

6. A device according to claim 2, wherein said semiconductor switching elements are MOSFETs.

7. A device according to claim 2, wherein said semiconductor switching elements are IGBTs.

8. A device according to claim 2, wherein a wiring pattern corresponding to the first common ground-potential line is formed on the same side of the drive-circuit wiring substrate as the side on which the wiring patterns corresponding to the individual component drive circuits are formed.

9. A device according to claim 2, wherein said main circuit is formed on a substrate separate from the drive-circuit wiring substrate, and the drive-circuit wiring substrate is a double-sided, printed wiring substrate.

10. A device according to claim 9, wherein said wiring pattern comprises a foil-like conductor on the drive-circuit wiring substrate.

11. A device according to claim 10, wherein a wiring pattern corresponding to the common ground-potential line is formed on the same side of the drive-circuit wiring substrate as the side on which the wiring patterns corresponding to the individual component drive circuits are formed.

12. A semiconductor device having a three-phase inverter function, which comprises:
 a main-circuit substrate;
 a main circuit having two branches, an upper arm and a lower arm;
 three semiconductor switching elements contained within each of the lower-arm and upper-arm circuit branches;
 a drive-circuit wiring substrate having an insulation layer, said drive-circuit wiring substrate being a double-sided, printed wiring substrate;
 a drive-circuit network mounted on the drive-circuit wiring substrate, the drive-circuit network comprising a first common ground-potential line, and six component drive circuits corresponding to the respective semiconductor switching elements for controlling switching operations, the individual component drive circuits being mounted on wiring patterns formed on the drive-circuit wiring substrate, each individual component drive circuit having a plurality of ground-potential points, with each of the plurality of ground-potential points within each individual component drive circuit being connected to a respective second common ground-potential line which is connected to the first common ground-potential line, so that, in device operation, each of the plurality of ground-potential points within each individual component drive circuit is at the same respective potential;
 wherein the wiring patterns for the component drive circuits associated with the upper-arm circuit branch are positioned relative to the wiring patterns for the component drive circuits associated with the lower-arm circuit branch such that any pair of the wiring patterns for the component drive circuits, consisting of a first wiring pattern for the component drive circuit associated with one of the upper-arm circuit branches and a second wiring pattern for the component drive circuit associated with one of the lower-arm circuit branches, do not mutually oppose each other with the first and the second wiring patterns being separated by the insulation layer of the drive-circuit wiring substrate.

13. A device according to claim 12, wherein a wiring pattern corresponding to the common ground-potential line is formed on the same side of the drive-circuit wiring substrate as the side on which the wiring patterns corresponding to the individual component drive circuits are formed.

14. A device according to claim 3, wherein said semiconductor switching elements are bipolar transistors.

15. A device according to claim 3, wherein said semiconductor switching elements are MOSFETs.

16. A device according to claim 3, wherein said semiconductor switching elements are IGBTs.

17. A device according to claim 3, wherein a wiring pattern corresponding to the first common ground-potential line is formed on the same side of the drive-circuit wiring substrate as the side on which the wiring patterns corresponding to the individual component drive circuits are formed.

* * * * *

UNITED STATES PATENT AND TRADEMARK OFFICE
CERTIFICATE OF CORRECTION

PATENT NO. : 5,576,575
DATED : November 19, 1969
INVENTOR(S) : Noriho Terasawa It is certified that error appears in the above-identified patent and that said Letters Patent is hereby corrected as shown below:

On the title page:

<u>Item 30</u>, "1993" should read --1992--.

Signed and Sealed this

Fourth Day of March, 1997

*Attest:*

BRUCE LEHMAN

*Attesting Officer*  *Commissioner of Patents and Trademarks*